US010971790B2

(12) United States Patent
Olivadese et al.

(10) Patent No.: US 10,971,790 B2
(45) Date of Patent: *Apr. 6, 2021

(54) WELL THERMALIZED MICROSTRIP FORMATION FOR FLEXIBLE CRYOGENIC MICROWAVE LINES IN QUANTUM APPLICATIONS

(71) Applicant: International Business Machines Corporation, Armonk, NY (US)

(72) Inventors: Salvatore B. Olivadese, Stamford, CT (US); Patryk Gumann, Tarrytown, NY (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/880,478

(22) Filed: May 21, 2020

(65) Prior Publication Data

US 2020/0280116 A1 Sep. 3, 2020

Related U.S. Application Data

(63) Continuation of application No. 16/125,470, filed on Sep. 7, 2018, now Pat. No. 10,749,235.

(51) Int. Cl.
*H01P 3/08* (2006.01)
*H01P 11/00* (2006.01)
*H01L 23/66* (2006.01)
*H01L 39/02* (2006.01)
*H01L 39/24* (2006.01)

(52) U.S. Cl.
CPC .............. *H01P 3/081* (2013.01); *H01L 23/66* (2013.01); *H01L 39/025* (2013.01); *H01L 39/2493* (2013.01); *H01P 11/003* (2013.01); *H01L 2223/6627* (2013.01)

(58) Field of Classification Search
CPC .......... H01P 3/081; H01P 3/082; H01P 3/084; H01P 3/085; H01P 3/087; H01P 3/088; H01P 11/003; H01L 23/66; H01L 39/2493; H01L 39/025; H01L 2223/6627
USPC .......... 333/236, 238, 246, 4, 5, 33, 156, 161, 333/202–205
See application file for complete search history.

(56) References Cited

U.S. PATENT DOCUMENTS 10,453,592 B1 * 10/2019 Smith .................... H01L 39/025

OTHER PUBLICATIONS

Tuckerman et al., "Flexible superconducting Nb transmission lines on thin film polyimide for quantum computing applications", pp. 1-22 (Year: 2016).*

(Continued)

*Primary Examiner* — Rakesh B Patel
*Assistant Examiner* — Jorge L Salazar, Jr.
(74) *Attorney, Agent, or Firm* — Garg Law Firm, PLLC; Rakesh Garg; Keivan Razavi

(57) ABSTRACT

A microstrip that is usable in a quantum application (q-microstrip) includes a ground plane, a polyimide film disposed over the ground plane at a first surface of the polyimide film, and a conductor formed on a second side of the polyimide film such that the first surface is substantially opposite to the second surface. A material of the conductor provides greater than a threshold thermal conductivity ($T_H$) with a structure of a dilution fridge stage (stage).

20 Claims, 7 Drawing Sheets

(56) References Cited

OTHER PUBLICATIONS

List of all IBM related dockets, 2020.

* cited by examiner

WELL THERMALIZED MICROSTRIP FORMATION FOR FLEXIBLE CRYOGENIC MICROWAVE LINES IN QUANTUM APPLICATIONS

BACKGROUND

The present invention relates generally to a device, a fabrication method, and fabrication system for forming electrical and thermal connections with superconducting qubits in a quantum computing environment. More particularly, the present invention relates to a device, method, and system for well thermalized microstrip formation for a cryogenic microwave line in quantum applications.

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states –|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

A quantum processor chip (QPC) can contain one or more qubits. A QPC can have one or more lines for microwave signal input or output. A common non-limiting embodiment of a microwave line is a coaxial cable carrying electromagnetic signal in the microwave frequency range.

Because presently available QPCs operate at ultra-low cryogenic temperatures, the lines, the readout circuits, and other peripheral components used in a quantum computing environment pass through one or more dilution refrigerator stage (compactly referred to herein as a "stage"). A stage operates to decrease the thermal state, or temperature, of lines and components entering at a high temperature side of the stage to the stage temperature—a temperature maintained at the stage. Thus, a series of stages progressively reduce the temperature of a line from room temperature (e.g., approximately 300 Kelvin (K)) to the cryogenic temperature at which the qubit operates, e.g., about 0.01 K.

A line from the final (lowest temperature) stage couples to the QPC. A signal from the qubit is conversely carried out on a line whose temperature progressively increases as the line passes through the series of stages in the direction away from the QPC. At each stage, including the final stage, the line has to connect to a semiconductor or superconductor circuit.

A microstrip is a planar conductive structure in which a conducting material is formed in the shape of a strip on one side of a dielectric substrate, with a ground plane on the opposite side of the substrate. A ground plane is a structure—often a conductive metallic structure—at a ground potential. The strip forms a conductor of the microstrip (hereinafter compactly and interchangeably referred to as a "conductor", "microstrip conductor", "MC" and their plural forms). Although commonly the conductor is formed in the forms of a substantially rectangular prism—having a substantially rectangular cross-section and a length—the illustrative embodiments contemplate other forms, such as cylindrical wires, also being formed and used as the conductor in a microstrip of an embodiment described herein.

Presently, a microstrip is used to couple a signal transmission line to a circuit. The illustrative embodiments recognize that the presently, microstrips and the methods of forming them is not suitable for quantum applications for a variety of reasons. For example, most microstrips that are fabricated in common dielectric substrates materials are usable only below 1 Gigahertz (GHz) and are not usable at cryogenic temperatures, particularly at temperatures below 4 K. Qubits operate at above 1 GHz and at temperatures significantly below 4 K. The microstrips that are fabricated using superconducting materials can operate below 4 K and above 1 GHz but are poor thermal conductors and are not suitable for soldered connections to lines.

The illustrative embodiments recognize that for a microstrip to be usable in a quantum computing environment, the microstrip should thermalize well within the stage. Thermalization of one structure to another structure is the process of constructing and coupling the two structures in such a way that the coupling achieves at least a threshold level of thermal conductivity between the two structures. Good thermalization, i.e., thermalization where the thermal conductivity between the thermally coupled structure exceeds the threshold level of required thermal conductivity. For example, a thermal conductivity of greater than a 1 Watt/(centimeter*K) at 4 Kelvin, is an acceptable threshold level $T_H$ of good thermal conductivity according to the illustrative embodiments.

The illustrative embodiments recognize that a manner of coupling a microwave line to a circuit in a stage or to a qubit should exhibit good thermalization, good electrical conductivity (e.g., exhibit a threshold ($T_C$) Residual Resistance Ratio (RRR) of at least 100), and provide this electrical and thermal performance at cryogenic temperatures down to a millikelvin and lower, e.g., to 0.000001 K. Furthermore, the manner of coupling should be reliably usable in soldered connections.

The illustrative embodiments recognize that presently formed microstrips, when used for microwave applications cause a significant crosstalk between adjacent microstrip conductors. Because the quantum applications are dealing with levels of energy as small as a single photon, microwave interference from crosstalk and other noise must meet far more stringent requirements than in non-quantum applications. For example, for microstrips to be usable in quantum applications, the crosstalk between MCs should be less than −50 decibels (dB).

SUMMARY

The illustrative embodiments provide a microstrip that is usable in a quantum application (q-microstrip), and a method and system of fabrication therefor. A q-microstrip of an embodiment includes a ground plane; a polyimide film disposed over the ground plane at a first surface of the polyimide film; and a conductor formed on a second side of the polyimide film such that the first surface is substantially opposite to the second surface, wherein a material of the conductor provides greater than a threshold thermal conductivity (TH) with a structure of a dilution fridge stage (stage), wherein the stage is maintained at a cryogenic temperature, and wherein the material of the conductor bonds at the cryogenic temperature with a second material of a part of a connector of a microwave line.

In another embodiment, the material of the conductor provides greater than a threshold electrical conductivity (TC) with an electrical component in the stage.

In another embodiment, Tc represents Residual Resistance Ratio (RRR) of at least 100.

Another embodiment further has a disposition of the conductor relative to a second conductor in the q-microstrip, wherein the disposition prevents a microwave crosstalk between the conductor and the second conductor from exceeding −50 decibels.

Another embodiment further has a height (H) of the polyimide film, wherein H is selected as a function of a dimension of the conductor such that a total impedance of the microwave line is approximately 50 ohms.

Another embodiment further includes a bonding material, wherein the bonding material bonds the conductor with the second material of the part of the connector of the microwave line at the cryogenic temperature.

In another embodiment, the cryogenic temperature is between and inclusive of 4 Kelvin and 0.01 Kelvin.

In another embodiment, TH is at least 1 watt per Kelvin centimeter.

In another embodiment, the polyimide film causes the conductor to have a flexibility characteristic, which allows the conductor to have a mechanical movement relative to ground plane.

An embodiment includes a fabrication method for fabricating the q-microstrip.

An embodiment includes a fabrication system for fabricating the q-microstrip.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
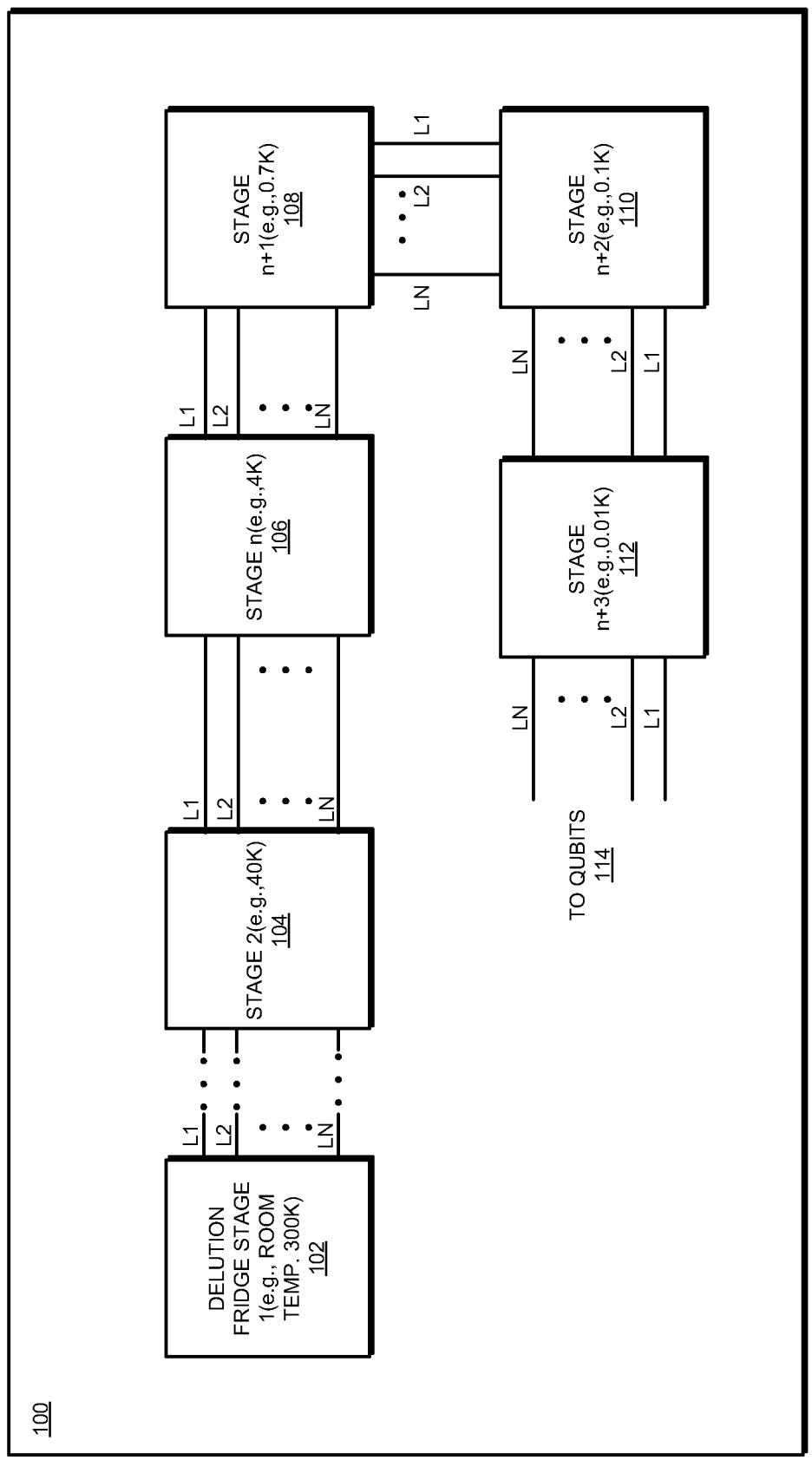
FIG. 1 depicts a block diagram of an example configuration of a series of stages in a quantum application where well thermalized q-microstrip provide microwave connections in accordance with an illustrative embodiment.

The illustrative embodiments used to describe the invention generally address and solve the above-described needs for microstrips that are particularly suited for the requirements of quantum applications (compactly referred to hereinafter as a q-microstrip). The illustrative embodiments provide well thermalized microstrip formation for a cryogenic microwave line in quantum applications.

An operation described herein as occurring with respect to a frequency of frequencies should be interpreted as occurring with respect to a signal of that frequency or frequencies. All references to a "signal" are references to a microwave signal unless expressly distinguished where used.

An embodiment provides a configuration of a q-microstrip. Another embodiment provides a fabrication method for the q-microstrip, such that the method can be implemented as a software application. The application implementing a fabrication method embodiment can be configured to operate in conjunction with an existing superconductor and/or semiconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example q-microstrip and its components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a structure that can be purposed or repurposed to provide a described function of a q-microstrip, and such adaptations are contemplated within the scope of the illustrative embodiments.

The illustrative embodiments are described with respect to certain types of materials, electrical properties, steps, shapes, sizes, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of a series of stages in a quantum application where well thermalized q-microstrip provide microwave connections in accordance with an illustrative embodiment. Stages 102, 104, 106, 108, 110, and 112 are some example dilution fridge stages, each maintaining a specified temperature, as described herein. For example, stage 102 may be at room temperature of approximately 300 K, and so on, with base stages 104-112 maintaining example temperatures of 40 K, 4 K, 0.7 K, 0.1 K, 0.01 K, respectively.

Lines L1, L2 . . . Ln carry microwave signals and pass through stages 102-112 towards qubit 114 or from qubit 114.

Figure 2:
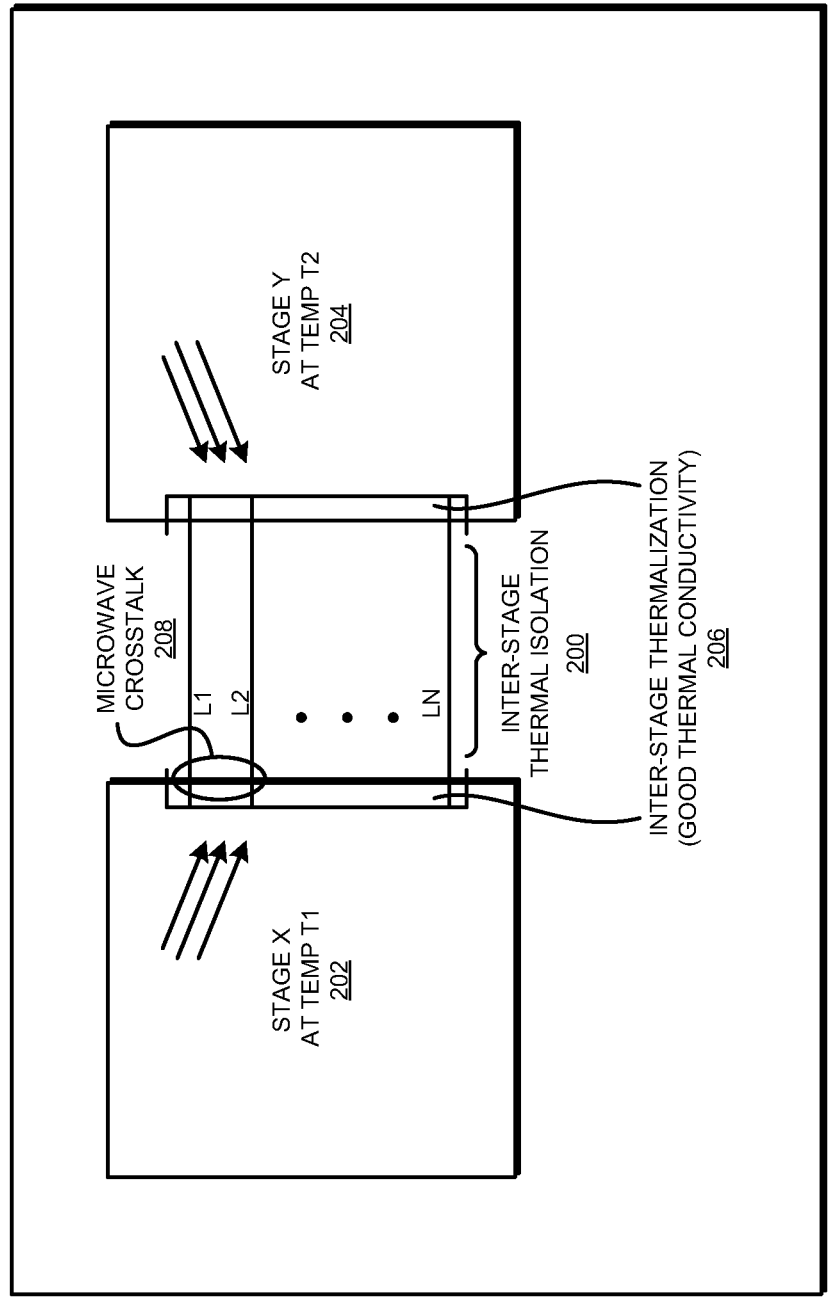
FIG. 2 depicts connections of lines within a stage which can be improved using q-microstrips in accordance with an illustrative embodiment.

With reference to FIG. 2, this figure depicts connections of lines within a stage which can be improved using q-microstrips in accordance with an illustrative embodiment. Stages 202 and 204 are examples of two consecutive stages in a series of stages, e.g., stages 104 and 106, or stages 106 and 108, or stages 108 and 110, or stages 110 and 112 in FIG. 1. Suppose that stage 202 is stage X maintaining temperature T1 and stage 204 is stage Y maintaining temperature T2 therein. Stages 202 and 204 are coupled via two or more lines L1 . . . Ln in the manner of FIG. 1.

When the lines enter a stage, the lines should be well thermalized with the stage. Connection area 206 in each of stages 202 and 204 is such an area, and connection area 206 is where the lines couple with a component of a quantum apparatus in a given stage. The potential for microwave crosstalk 208 exists between adjacent lines and connection points in area 206. Presently, prior-art microstrips in connection area 206 cause undesirable level of crosstalk and poor thermalization for the reasons described herein. A q-microstrip in connection area 206 improves thermalization of the lines and connectors to a stage, and also facilitates higher density of connections as compared to the prior-art microstrips without causing the crosstalk to exceed −50 dB.

Figure 3:
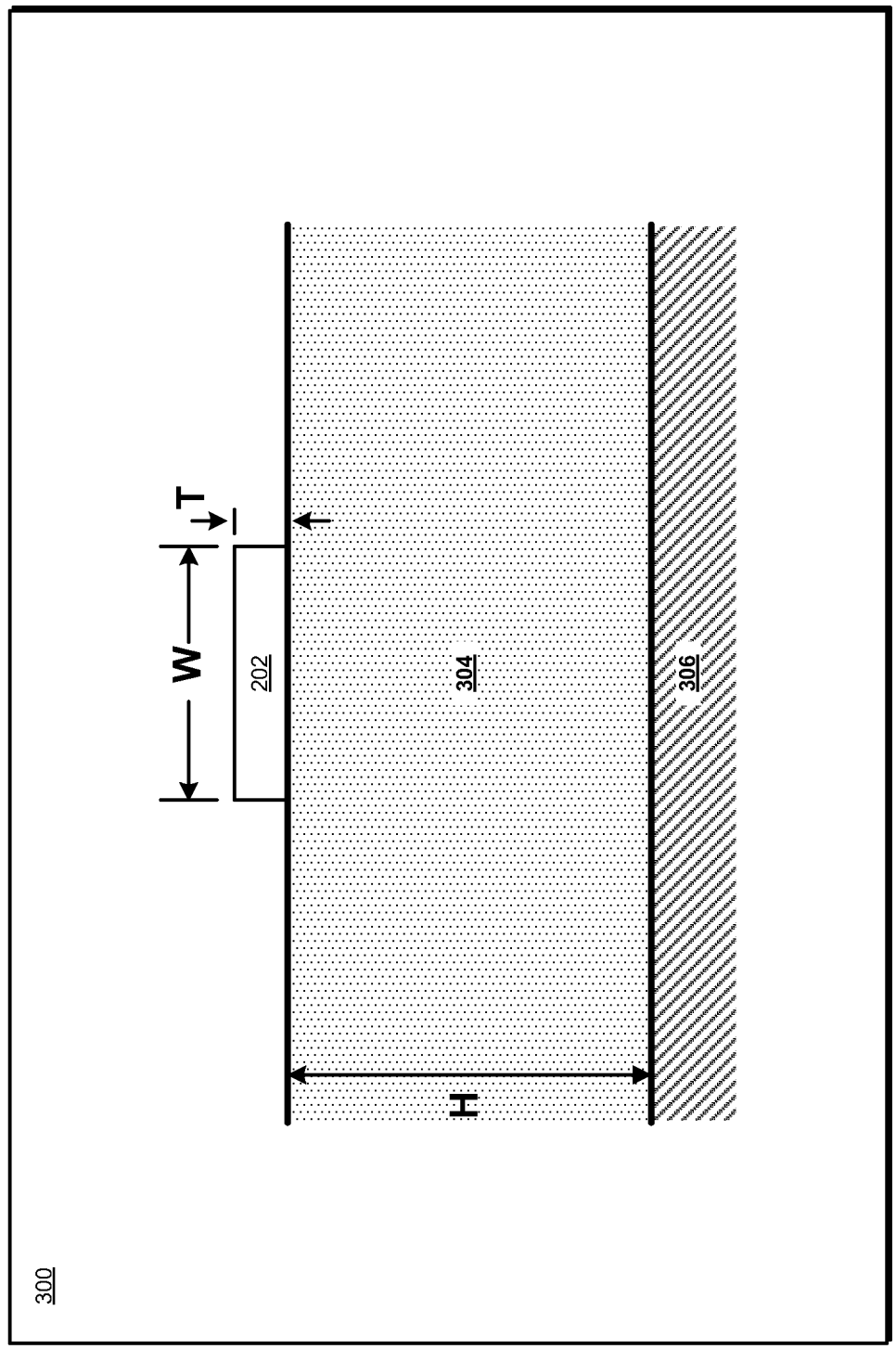
FIG. 3 depicts a block diagram of a configuration of a q-microstrip in accordance with an illustrative embodiment.

With reference to FIG. 3, this figure depicts a block diagram of a configuration of a q-microstrip in accordance with an illustrative embodiment. Configuration 300 depicts MC 302 in an insulator, e.g., substrate 304, which is disposed between MC 302 and ground plane 306. The materials used for MC 302 and ground planes 306 can be, but need not be, the same.

In the non-limiting depiction of this figure, MC 302 has widths W and thickness T. When formed in a set of MCs, MC 302 and another MC (not shown) are separated from each other by separation distance S (not shown). In one embodiment, the separation distance S between MCs 302 and an adjacent MC is a function of a dimension of one or both MCs.

H is the total thickness of substrate 304. For example, when MC 302 has a rectangular profile as shown in this non-limiting example, H is a function of dimension T, the thickness of MC 302 such that the total impedance of the microwave line coupling to MC 302 is approximately 50 Ohms. In another embodiment, e.g., when MCs 302 and/or another MC have a different shape, such as in the case of cylindrical MCs, H would be a function of the radius of one or both cylinders.

The material selection for forming MC 302 is important for extracting a desirable performance from MC 302 in quantum applications. The conductive material used for MC 302 should, (i) at a cryogenic temperature maintained at any of the base stages shown in FIG. 1, exhibit (ii) good thermalization, i.e., greater than a threshold thermal conductivity as described herein, (iii) good electrical conductivity, i.e., greater than a threshold RRR as described herein, and (iv) form a reliable electrical and thermal bond with a connector via soldering or other metal-to-metal bonding method.

Generally, any metal or alloy that exhibits properties (i)-(iv) is usable to form MC 302. Experimentation and testing for the illustrative embodiments has determined that a copper-nickel alloy (CuNi) alloy exhibits properties (i)-(iv) described herein. Therefore, in one embodiment, CuNi is usable to form MS 302.

Figure 4:
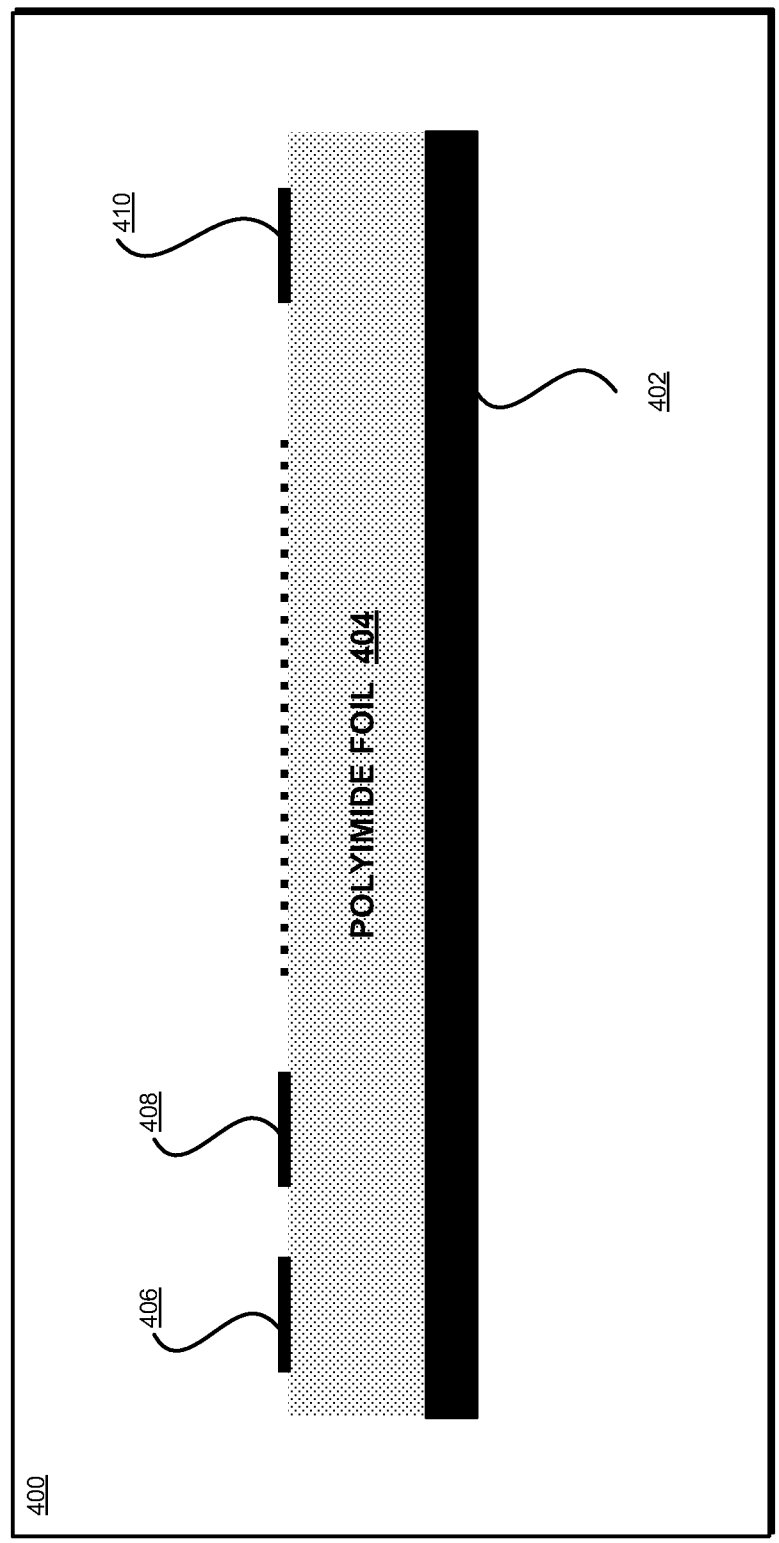
FIG. 4 depicts a configuration of a q-microstrip, and a method for forming the q-microstrip in accordance with an illustrative embodiment.

With reference to FIG. 4, this figure depicts a configuration of a q-microstrip, and a method for forming the q-microstrip in accordance with an illustrative embodiment. Configuration 400 is a specific example of configuration 300. Configuration 400 can be used in connection area 206 in FIG. 2 to achieve microstrip connections with properties (i)-(iv). Metal layer 402 forms a ground plane. Layer 404 of polyimide having at least thickness H, as described with respect to FIG. 3, is deposited over ground plane 402. In one embodiment, a commercially available polyimide film of thickness at least H can be used as structure 404.

A suitable thin metal deposition technique is used by an embodiment to deposit one or more MCs, such as MCs 406, 408 . . . 410 to form any number of MCs of microstrip configuration 400. In one embodiment, the MCs are formed with approximately a rectangular profile having a thickness T of less than 1 micrometer and width W being proportional to the width of a connector with which the microstrip will bond. As noted herein, H is a function of W and T to yield approximately 50 Ohm line impedance.

Advantageously, the illustrative embodiments use polyimide 404 as the dielectric to impart a flexibility characteristic to MCs 406, 408 . . . 410 placed upon film 404. The flexibility of MCs 406, 408 . . . 410 renders MCs 406, 408 . . . 410 more receptive to bonding with their respective connectors in a manner described herein, as compared to rigid conductors formed in other dielectric substrates. The flexibility allows the MCs some mechanical movement relative to ground plane 402 such that a connector and/or an MC can be mechanically moved to align and bond with each other.

Figure 5:
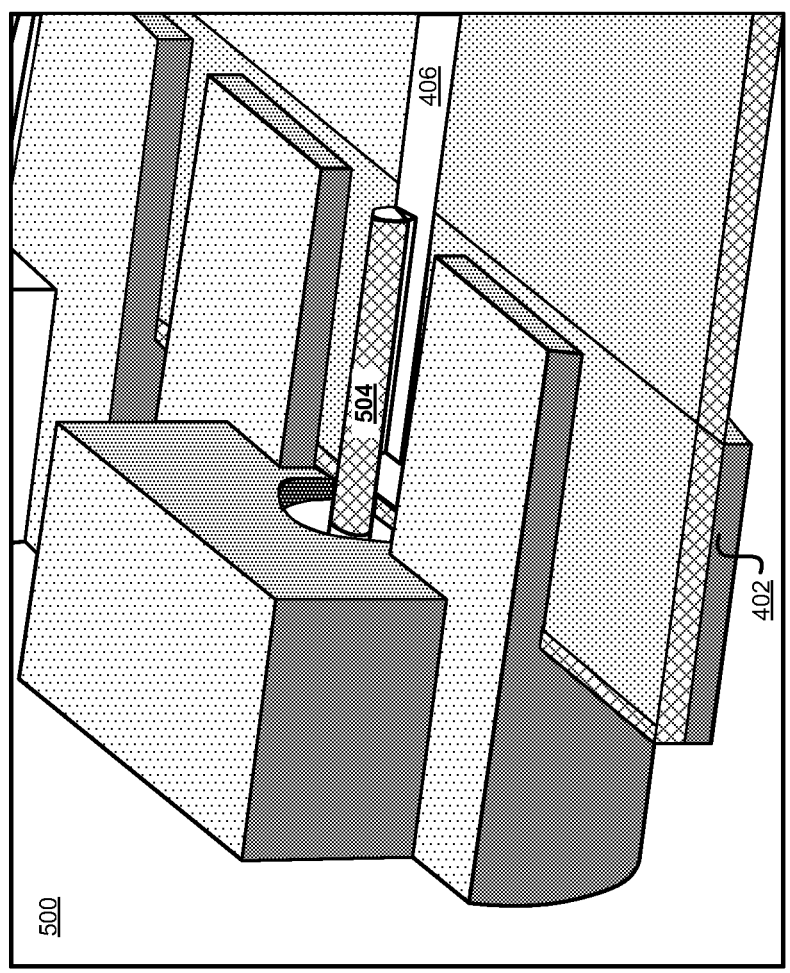
FIG. 5 depicts a schematic of an example connector usable with a q-microstrip in accordance with an illustrative embodiment.

With reference to FIG. 5, this figure depicts a schematic of an example connector usable with a q-microstrip in accordance with an illustrative embodiment. Ground plane 402, polyimide film 404, and microstrip 404 are the same as depicted and described with respect to FIG. 4.

Connector 502 is an industry-standard connector or a proprietary connector fastened to an end of a microwave signal line. Connector 502 comprises pin 504 or a similarly purposed structure, which can be electrically and thermally coupled with microstrip 406 using bonding material 506. In one embodiment, bonding material 506 is a soldering alloy. The connection formed in this manner between a line coupled to connector 502 and MC 406 exhibits good thermalization relative to the thresholds described herein, electrical conductivity for electromagnetic signals in quantum applications, at cryogenic temperatures described herein for quantum applications, while producing microwave crosstalk below the threshold for quantum applications.

Figure 6:
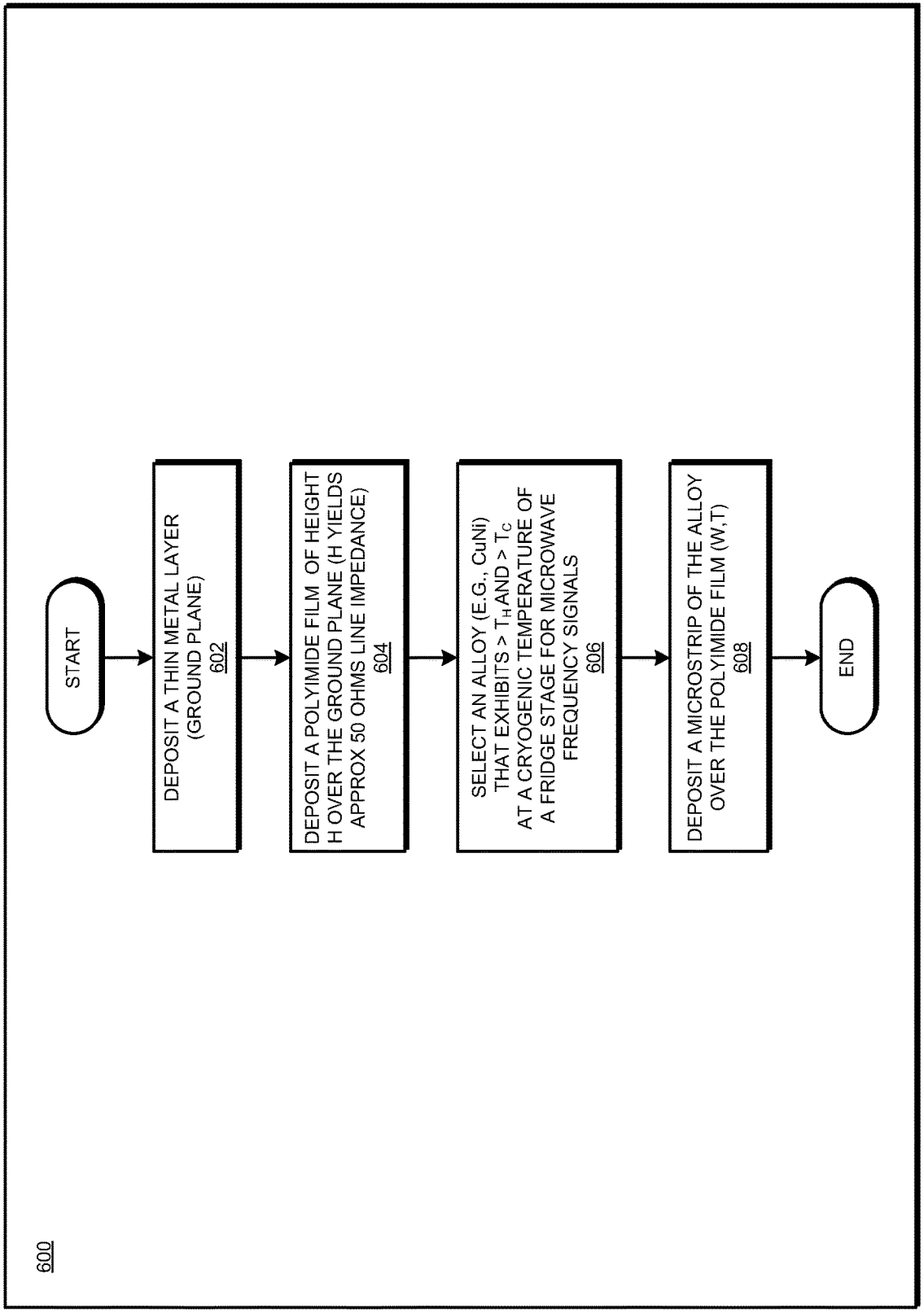
FIG. 6 depicts a flowchart of an example process for fabricating a q-microstrip in accordance with an illustrative embodiment.

With reference to FIG. 6, this figure depicts a flowchart of an example process for fabricating a q-microstrip in accordance with an illustrative embodiment. Process 600 of an embodiment can be implemented in a software application to operate a semiconductor or superconductor fabrication apparatus, or in a fabrication system that operates to fabricate semiconductor or superconductor devices.

Process 600 deposits a metal layer to form a ground plane (block 602). The ground plane can be formed using a superconducting material in one embodiment.

Process 600 deposits a polyimide film of at least H thickness over the ground plane (block 604). H is selected to yield approximately 50 ohms of line impedance, as described herein.

Process 600 selects a material, metal, or alloy, which exhibits greater than $T_H$ thermal conductivity, greater than $T_C$ electrical conductivity at a cryogenic temperature maintained at one or more dilution fridge stages for microwave frequency signals (block 606). As a non-limiting example, CuNi alloy can be selected at block 606.

Process 600 deposits a thin microstrip of the selected material of block 606, over the polyimide film (block 608). In one non-limiting implementation, the microfilm has a rectangular profile having a thickness T and width W. Process 600 ends thereafter.

Figure 7:
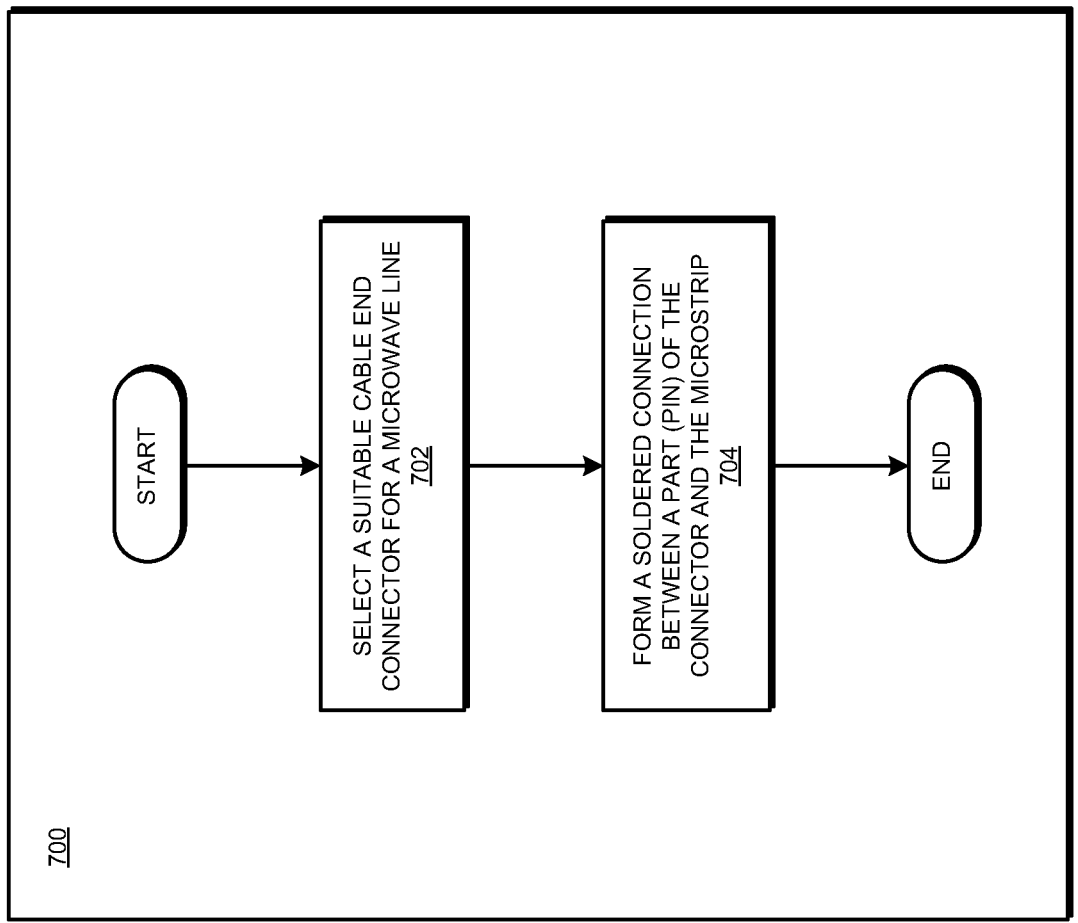
FIG. 7 depicts a flowchart of an example process for forming a line connection using a q-microstrip in accordance with an illustrative embodiment.

With reference to FIG. 7, this figure depicts a flowchart of an example process for forming a line connection using a q-microstrip in accordance with an illustrative embodiment. The line connection of process 700 uses the microstrip formed y process 600 of FIG. 6.

Process 700 selects a suitable cable connector for a line carrying microwave signals at cryogenic temperatures (block 702). Process 700 forms a bonded connection, e.g., using a soldering material, between a part—e.g., a pin—of the connector and the microstrip (block 704). Process 700 ends thereafter.

A substrate contemplated within the scope of the illustrative embodiments can be formed using any suitable substrate material, such as, for example, monocrystalline Silicon (Si), Silicon-Germanium (SiGe), Silicon-Carbon (SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, the substrate includes a buried oxide layer (not depicted).

The conductor can comprise any suitable conducting material, including but not limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition.

Examples of superconducting materials (at low temperatures, such as about 10-100 millikelvin (mK), or about 4 K) include Niobium, Aluminum, Tantalum, etc. The lines can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A microstrip that is usable in a quantum application (q-microstrip) comprising:
    a ground plane;
    a polyimide film disposed over the ground plane at a first surface of the polyimide film; and
    a conductor formed on a second surface of the polyimide film such that the first surface is substantially opposite to the second surface, wherein a material of the conductor provides greater than a threshold thermal conductivity (TH) with a structure of a dilution fridge stage (stage).

2. The q-microstrip of claim 1, wherein the material of the conductor provides greater than a threshold electrical conductivity (TC) with the structure of the stage, and wherein the structure comprises an electrical component in the stage.

3. The q-microstrip of claim 2, wherein Tc represents Residual Resistance Ratio (RRR) of at least 100.

4. The q-micro strip of claim 2, further comprising:
    a disposition of the conductor relative to a second conductor in the q-micro strip, wherein the disposition prevents a microwave crosstalk between the conductor and the second conductor from exceeding −50 decibels.

5. The q-microstrip of claim 1, further comprising:
    a bonding material, wherein the bonding material bonds the conductor with a second material of a part of a connector of a microwave line at a cryogenic temperature.

6. The q-microstrip of claim 5, further comprising:
    a height (H) of the polyimide film, wherein H is selected as a function of a dimension of the conductor such that a total impedance of the microwave line is approximately 50 ohms.

7. The q-microstrip of claim 1, wherein the stage is maintained at a cryogenic temperature, and wherein the cryogenic temperature is between and inclusive of 4 Kelvin and 0.01 Kelvin.

8. The q-microstrip of claim 1, wherein TH is at least 1 watt per Kelvin centimeter.

9. The q-microstrip of claim 1, wherein the polyimide film causes the conductor to have a flexibility characteristic, which allows the conductor to have a mechanical movement relative to the ground plane.

10. A method to fabricate a microstrip that is usable in a quantum application (q-microstrip), comprising:
    forming a ground plane;
    forming a polyimide film disposed over the ground plane at a first surface of the polyimide film; and
    forming a conductor on a second surface of the polyimide film such that the first surface is substantially opposite to the second surface, wherein a material of the conductor provides greater than a threshold thermal conductivity (TH) with a structure of a dilution fridge stage (stage).

11. The method of claim 10, wherein the material of the conductor provides greater than a threshold electrical conductivity (TC) with the structure of the stage, and wherein the structure comprises an electrical component in the stage.

12. The method of claim 11, wherein Tc represents Residual Resistance Ratio (RRR) of at least 100.

13. The method of claim 11, further comprising:
    creating a disposition of the conductor relative to a second conductor in the q-microstrip, wherein the disposition prevents a microwave crosstalk between the conductor and the second conductor from exceeding −50 decibels.

14. The method of claim 10, further comprising:
forming a bond using a bonding material, wherein a bonding material bonds the conductor with a second material of a part of a connector of a microwave line at a cryogenic temperature.

15. The method of claim 14, further comprising:
setting a height (H) of the polyimide film, wherein H is selected as a function of a dimension of the conductor such that a total impedance of the microwave line is approximately 50 ohms.

16. The method of claim 10, wherein the stage is maintained at a cryogenic temperature, and wherein the cryogenic temperature is between and inclusive of 4 Kelvin and 0.01 Kelvin.

17. The method of claim 10, wherein TH is at least 1 watt per Kelvin centimeter.

18. The method of claim 10, wherein the polyimide film causes the conductor to have a flexibility characteristic, which allows the conductor to have a mechanical movement relative to the ground plane.

19. A fabrication system which when operated to fabricate a microstrip that is usable in a quantum application (q-microstrip) performs operations comprising:

forming a ground plane;

forming a polyimide film disposed over the ground plane at a first surface of the polyimide film; and forming a conductor on a second surface of the polyimide film such that the first surface is substantially opposite to the second surface, wherein a material of the conductor provides greater than a threshold thermal conductivity (TH) with a structure of a dilution fridge stage (stage).

20. The fabrication system of claim 19, wherein the material of the conductor provides greater than a threshold electrical conductivity (TC) with the structure of the stage, and wherein the structure comprises an electrical component in the stage.

* * * * *